US012642136B2

(12) United States Patent
Oh et al.

(10) Patent No.: US 12,642,136 B2
(45) Date of Patent: May 26, 2026

(54) DISPLAY DEVICE COMPRISING SEMICONDUCTOR LIGHT EMITTING ELEMENT

(71) Applicant: LG ELECTRONICS INC., Seoul (KR)

(72) Inventors: Taesu Oh, Seoul (KR); Joonkwon Moon, Seoul (KR); Sungjin Park, Seoul (KR); Bongseok Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 766 days.

(21) Appl. No.: 18/009,470

(22) PCT Filed: Jun. 12, 2020

(86) PCT No.: PCT/KR2020/007622

§ 371 (c)(1),
(2) Date: Dec. 9, 2022

(87) PCT Pub. No.: WO2021/251529

PCT Pub. Date: Dec. 16, 2021

(65) Prior Publication Data

US 2023/0215845 A1      Jul. 6, 2023

(51) Int. Cl.
*H10W 90/00*          (2026.01)

(52) U.S. Cl.
CPC ................................... *H10W 90/00* (2026.01)

(58) Field of Classification Search
CPC ........ H01L 25/0753; G09G 2300/0452; G09G 2330/08; G09G 2330/10; G09G 3/32; H10W 90/00; H10H 20/851; H10H 29/142
See application file for complete search history.

(56) References Cited

U.S. PATENT DOCUMENTS 10,535,295 B2 *  1/2020  Hughes .............. H01L 25/0753
2015/0187249 A1  7/2015  Tani et al.
(Continued)

FOREIGN PATENT DOCUMENTS

KR    10-2005-0055975 A    6/2005
KR    10-2015-0080949 A    7/2015
(Continued)

OTHER PUBLICATIONS

International Search Report, issued in PCT/KR2020/007622, PCT/ISA/210, dated Mar. 9, 2021.

*Primary Examiner* — Ratisha Mehta
(74) *Attorney, Agent, or Firm* — Birch, Stewart, Kolasch & Birch, LLP

(57) ABSTRACT

An embodiment relates to a display device comprising a semiconductor light-emitting device. A display device comprising a semiconductor light-emitting device, according to an embodiment, can comprise: a main pixel group including a plurality of main pixels; and a shared redundancy pixel including a plurality of shared light-emitting devices arranged between and on the periphery of the plurality of main pixels. The main pixel group can comprise the plurality of main pixels, each of which includes a first semiconductor light-emitting device, a second semiconductor light-emitting device, and a third semiconductor light-emitting device. The shared redundancy pixel can comprise: first group shared light-emitting devices arranged between the plurality of main pixels; and second shared light-emitting devices arranged on the periphery of the plurality of main pixels.

17 Claims, 8 Drawing Sheets

(56) References Cited

U.S. PATENT DOCUMENTS

| | | | |
|---|---|---|---|
| 2017/0287988 A1 | 10/2017 | Lee et al. | |
| 2018/0211940 A1* | 7/2018 | Henry | H10H 20/814 |
| 2019/0340970 A1 | 11/2019 | Kirisken | |
| 2020/0365071 A1* | 11/2020 | Jeong | G09G 3/3233 |

FOREIGN PATENT DOCUMENTS

| | | | |
|---|---|---|---|
| KR | 10-2017-0112894 A | 10/2017 |
| KR | 10-2018-0117743 A | 10/2018 |
| KR | 10-2019-0070633 A | 6/2019 |
| KR | 10-2019-0079141 A | 7/2019 |

* cited by examiner

[FIG. 1]
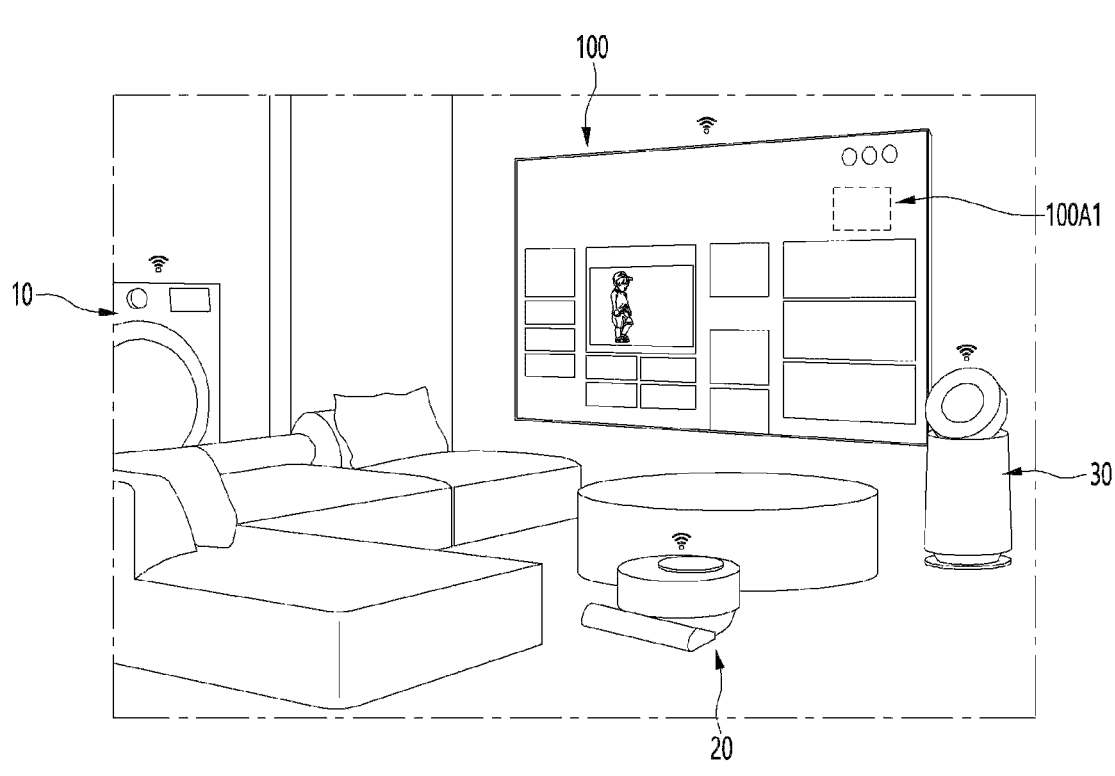

[FIG. 2]
100A1
R G B    R G B    R G B    R G B    R G B    R G B    R G B    ← 150M
R    G    B    R    G    B    ← 160C
R G B    R G B    R G B    R G B    R G B    R G B    R G B
G    B    R    G    B    R
R G B    R G B    R G B    R G B    R G B    R G B    R G B    150L
B    R    G    B    R    G
R G B    R G B    R G B    R G B    R G B    R G B    R G B
R    G    B    R    G    B
R G B    R G B    R G B    R G B    R G B    R G B    R G B
[FIG. 3A]
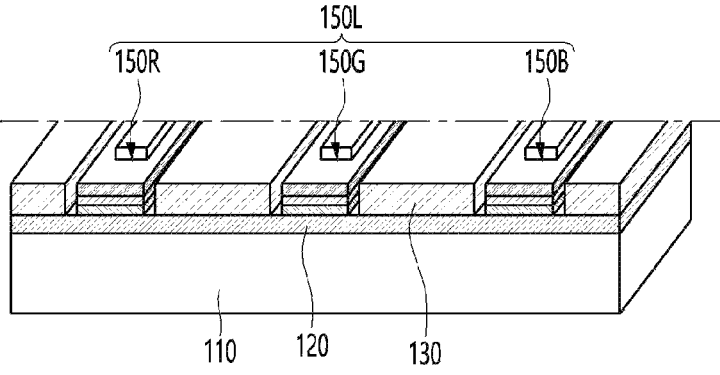
150L
150R    150G    150B
110    120    130

[FIG. 3B]
150R
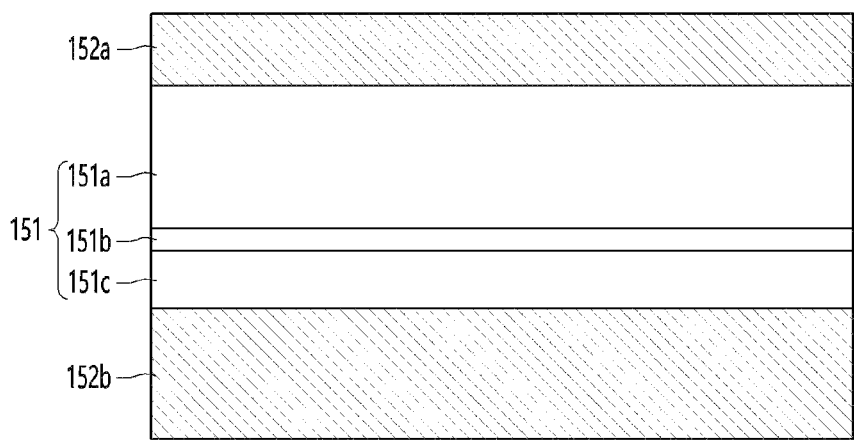
[FIG. 4A]
100A1
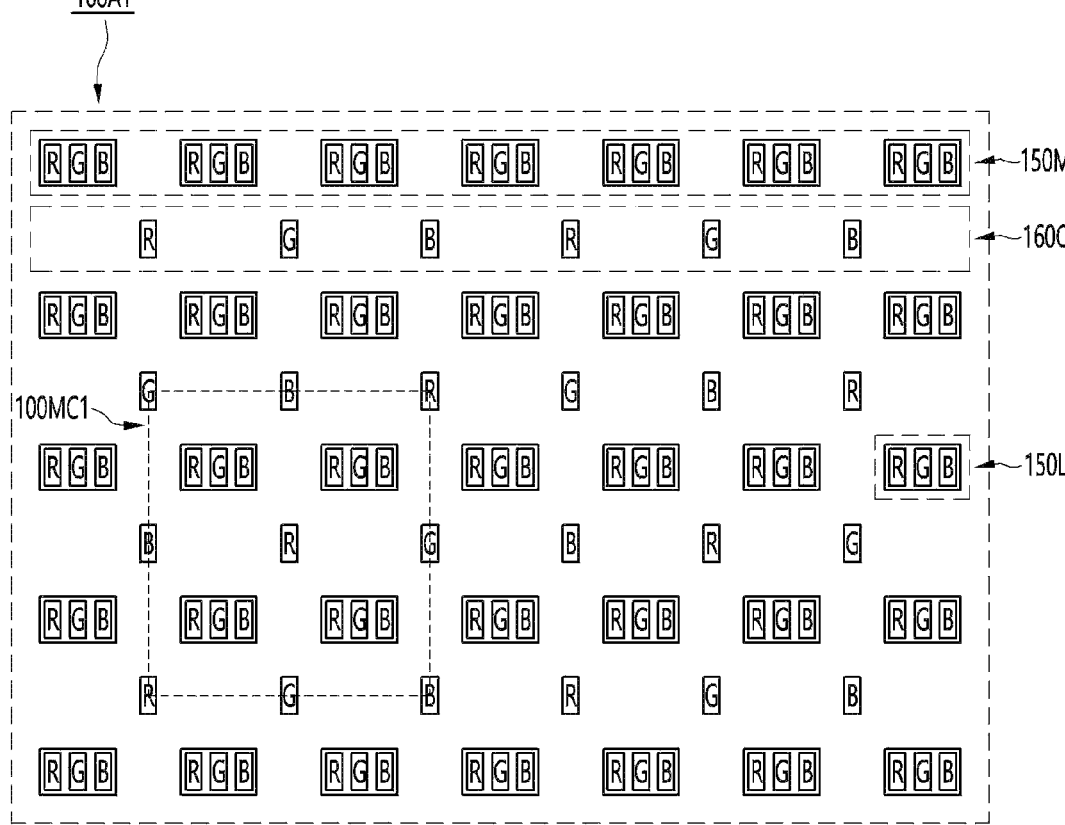

[FIG. 4B]
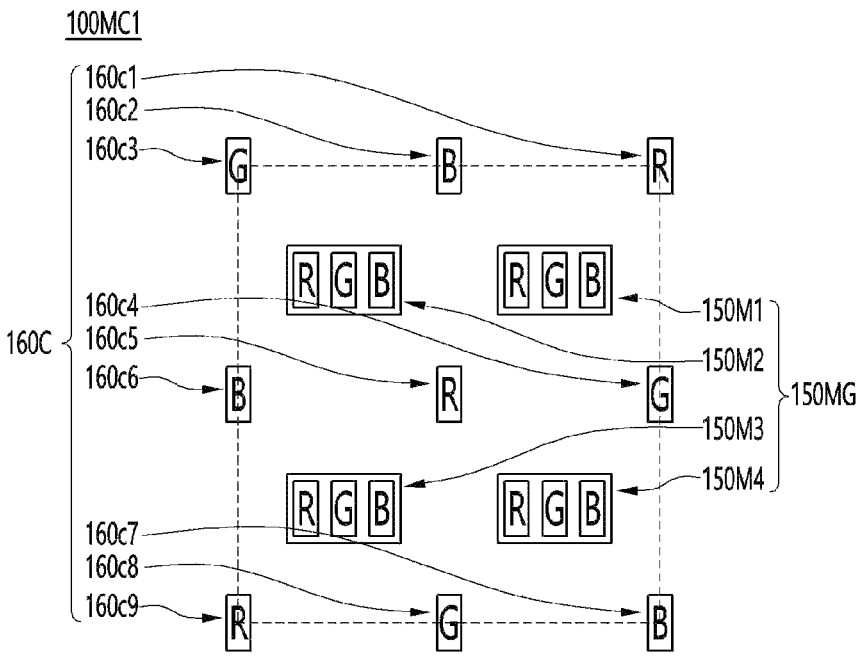
[FIG. 5A]
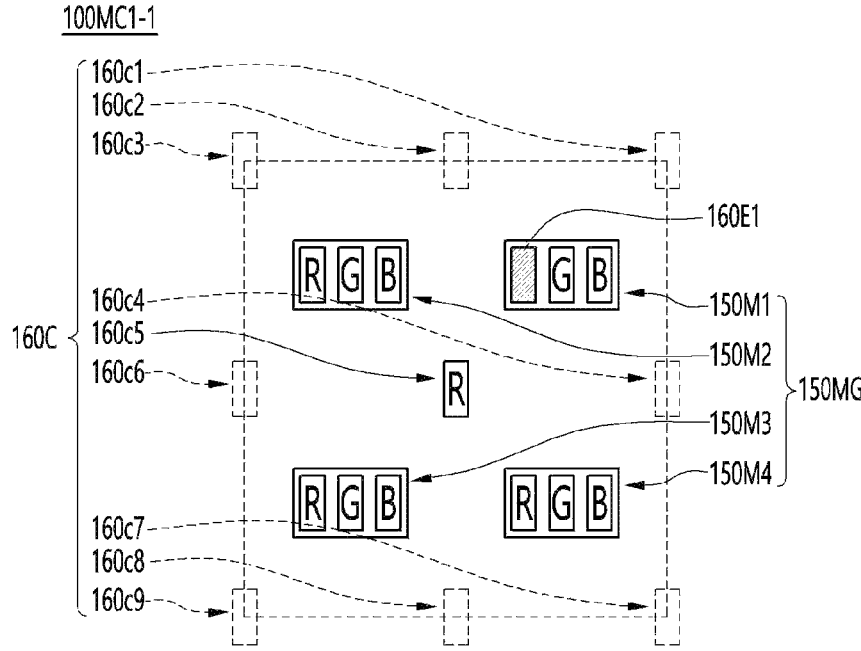

[FIG. 5B]
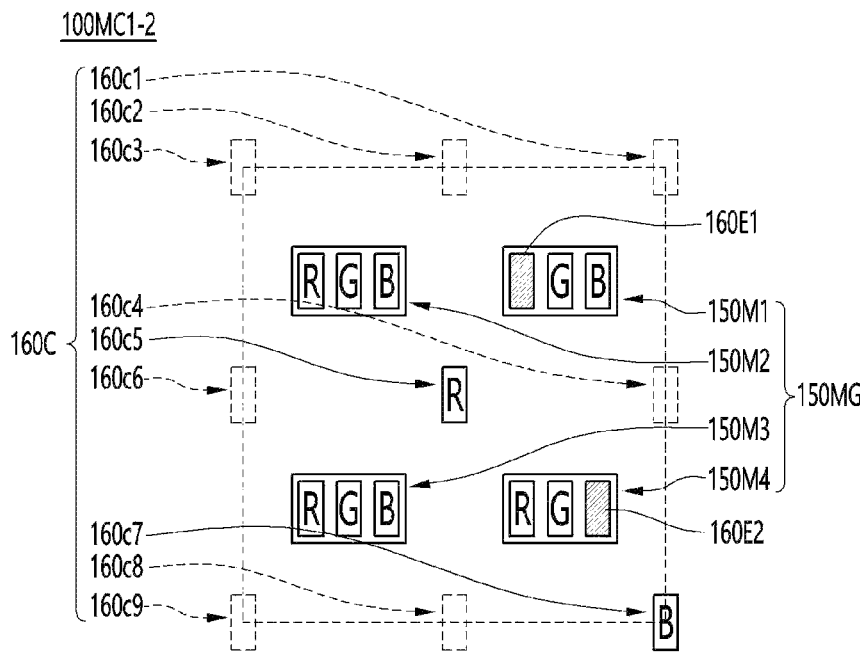
[FIG. 5C]
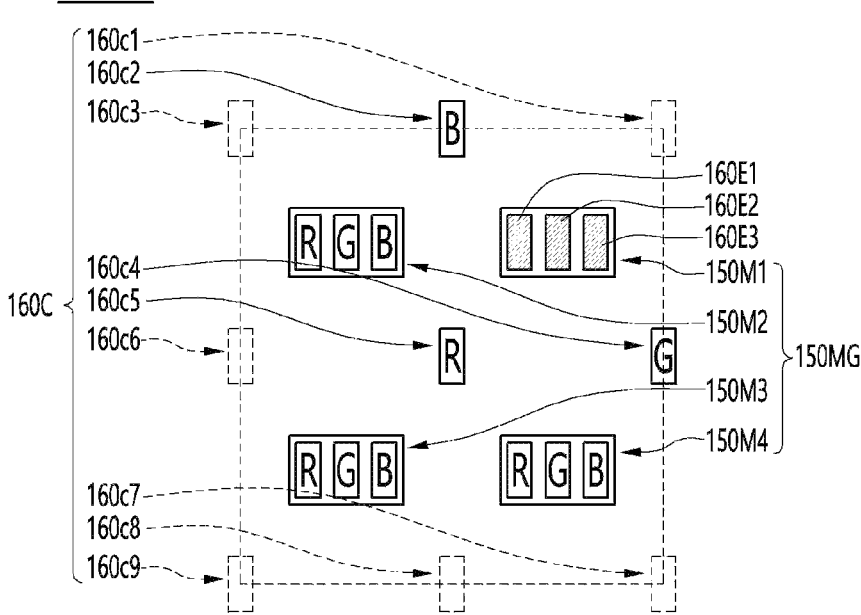

[FIG. 5D]
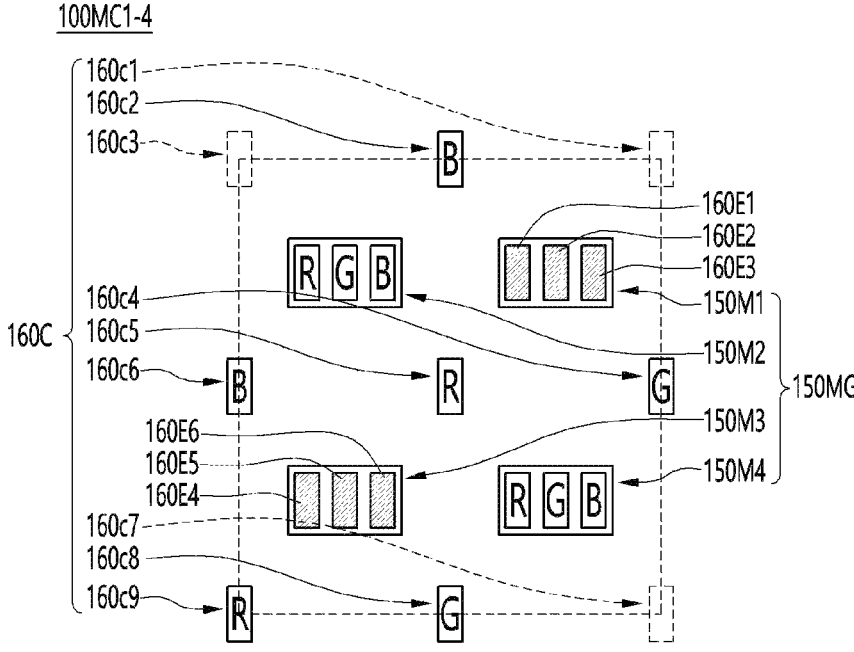
[FIG. 6]
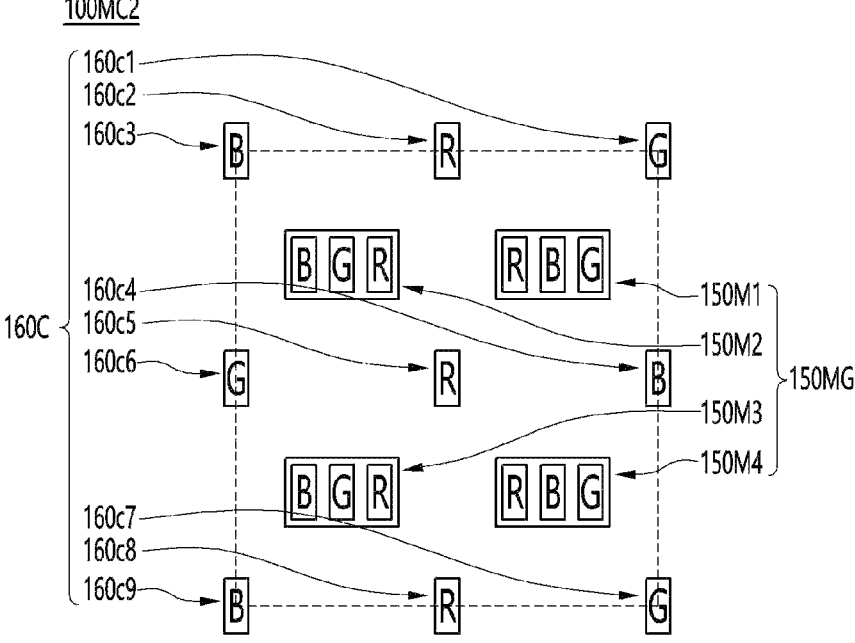

[FIG. 7A]

[FIG. 7B]
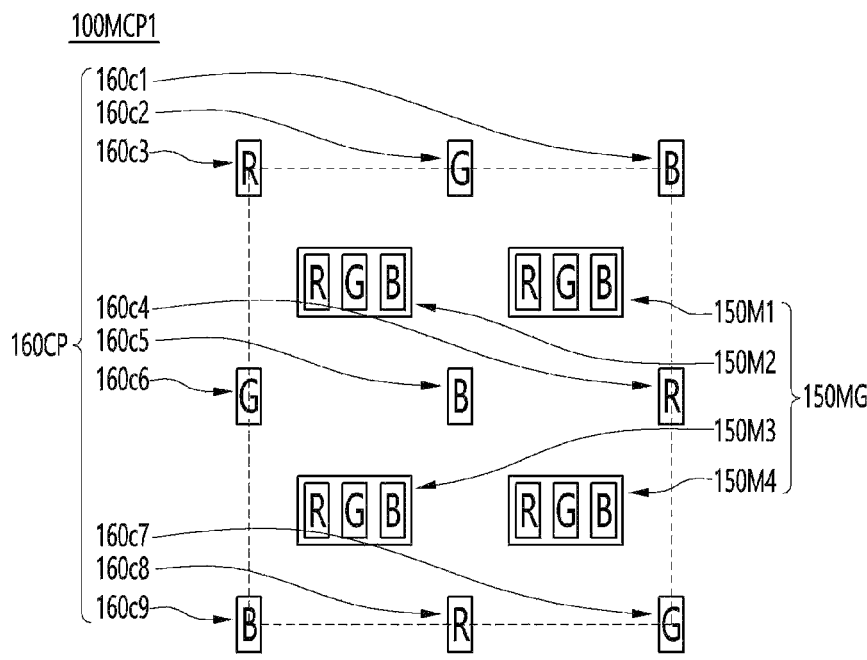
[FIG. 8]
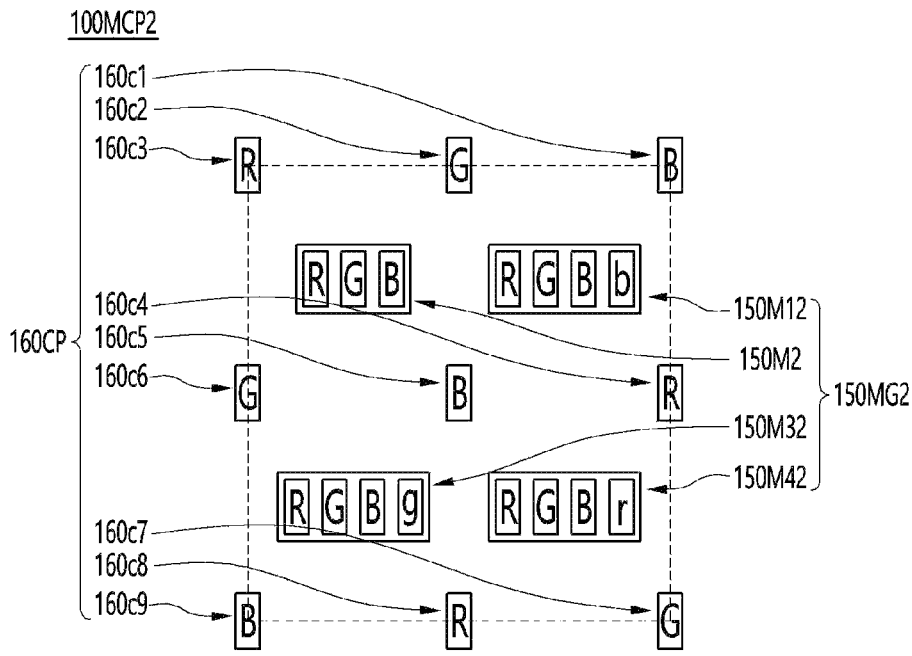

DISPLAY DEVICE COMPRISING SEMICONDUCTOR LIGHT EMITTING ELEMENT

CROSS REFERENCE TO RELATED APPLICATIONS

This application is the National Phase of PCT/KR2020/007622 filed on Jun. 12, 2020, which is hereby expressly incorporated by reference into the present application.

TECHNICAL FIELD

The embodiment relates to a display device including a semiconductor light emitting device.

BACKGROUND ART

Technologies for implementing large-area displays include liquid crystal displays (LCDs), OLED displays, and micro-LED displays.

Among them, the micro-LED display is a display using micro-LED, which is a semiconductor light emitting device having a diameter or cross-sectional area of 100 μm or less, as a display device.

Micro-LED display has excellent performance in many characteristics such as contrast ratio, response speed, color reproduction rate, viewing angle, brightness, resolution, lifespan, luminous efficiency and luminance because it uses micro-LED, which is a semiconductor light emitting device, as a display device.

In particular, the micro-LED display has the advantage of being able to separate and combine the screens in a modular way, so that the size or resolution can be adjusted freely and the flexible display can be implemented.

However, there is a technical problem in that it is difficult to quickly and accurately transfer the semiconductor light emitting device to the display panel because more than millions of semiconductor light emitting devices are required for a large micro-LED display.

Transfer technologies that have been recently developed include a pick and place process, a laser lift-off method, or a self-assembly method.

Meanwhile, in order to improve the low transfer rate and lighting rate of the micro-LED display, in the prior art, a method of arranging a main pixel and an auxiliary pixel at the same time or using a repair chip to secure a yield has been proposed.

However, in the method of using the auxiliary pixels, since the same number of auxiliary chips as the main pixel should be arranged, twice as many chips are transferred than the actual required chips. Accordingly, the conventional method of using the auxiliary pixel increases the difficulty of panel design and transfer process, and has a problem of increasing the chip material cost.

DISCLOSURE

Technical Problem

One of the technical problems of the embodiment is to provide a display device including a semiconductor light emitting device capable of reducing the difficulty of panel design and transfer process while improving the yield.

The technical problems of the embodiment are not limited to those described in this item, and include those that can be understood through the description of the invention.

Technical Solution

A display device including a semiconductor light emitting device according to an embodiment can include a main pixel group 150MG including a plurality of main pixels and a shared redundancy pixel 160C including a plurality of shared light emitting devices disposed between the plurality of main pixels and around thereof.

The main pixel group 150MG can include a plurality of main pixels including a first semiconductor light emitting device R, a second semiconductor light emitting device G, and a third semiconductor light emitting device B.

The shared redundancy pixel (160C) can include a first group shared light emitting device disposed between the plurality of main pixels, and a second group shared light emitting device disposed around the plurality of main pixels The main pixel group 150MG can include a first main pixel 150M1, a second main pixel 150M2, a third main pixel 150M3, and a fourth main pixel 150M4 disposed adjacent to each other.

The first group shared light emitting device disposed between the plurality of main pixels can include a fifth shared light emitting device 160c5.

The second group shared light emitting device disposed around the plurality of main pixels can include first to fourth and sixth to ninth shared light emitting devices 160c1, 160c2, 160c3, 160c4, 160c5, 160c6, 160c7, 160c8, 160c9.

The first semiconductor light emitting device R, the second semiconductor light emitting device G, and the third semiconductor light emitting device B can be a red light emitting device R, a green light emitting device G, and a blue light emitting device B, respectively.

The first shared light emitting device 160c1, the fifth shared light emitting device 160c5, and the ninth shared light emitting device 160c9 can be a Red R shared light emitting device.

The third shared light emitting device 160c3, the fourth shared light emitting device 160c4, and the eighth shared light emitting device 160c8 can be a Green (G) shared light emitting device.

The second shared light emitting device 160c2, the sixth shared light emitting device 160c6, and the seventh shared light emitting device 160c7 can be a blue B shared light emitting device.

The first error light emitting device 160E1 may include a defective light emitting device for emitting red light in the first main pixel 150M1.

Among the shared redundancy pixels, the fifth shared light emitting device 160c5 emitting red light among the shared light emitting devices adjacent to the first error light emitting device 160E1 can emit light as an auxiliary pixel.

The fourth main pixel 150M4 may include a second error light emitting device 160E2 in which the blue light emitting device is defective, among the shared redundancy pixels, the seventh shared light emitting device 160c7 emitting blue light among the shared light emitting devices adjacent to the second error light emitting device 160E2 can emit light as an auxiliary pixel.

A first error light emitting element 160E1, a second error light emitting device 160E2 and a third error light emitting device 160E3 can be included in an area corresponding to the area emitting red, blue, and green, respectively, in the first main pixel 150M1.

Among the shared redundancy pixels, the fifth shared light emitting device 160c5 adjacent to the first error light emitting device 160E1 and emitting red can emit light as an auxiliary pixel. The fourth shared light emitting device 160c4 adjacent to the second error light emitting device 160E2 and emitting green can emit light as an auxiliary pixel. The second shared light emitting device 160c2 adjacent to the third error light emitting device 160E3 and emitting blue can emit light as an auxiliary pixel.

The third main pixel 150M3 can include a fourth error light emitting device 160E4, a fifth error light emitting device 160E5, and a sixth error light emitting device 160E6 in areas corresponding to areas emitting red, blue, and green, respectively. Among the shared redundancy pixels, the nine shared light emitting devices 160c9 adjacent to the fourth error light emitting device 160E4 and emitting red light can emit light as an auxiliary pixel. The eighth shared light emitting device 160c8 adjacent to the fifth error light emitting device 160E5 and emitting green can emit light as an auxiliary pixel. The sixth shared light emitting device 160c6 adjacent to the sixth error light emitting device 160E6 and emitting blue can emit light as an auxiliary pixel.

The first semiconductor light emitting device R, the second semiconductor light emitting device G and the third semiconductor light emitting device B can be a red light emitting device R, a green light emitting device G, and a blue light emitting device B, respectively. The second shared light emitting device 160c2, the fifth shared light emitting device 160c5, and the eighth shared light emitting device 160c8 can be a red shared light emitting device. The first shared light emitting device 160c1, the sixth shared light emitting device 160c6, and the seventh shared light emitting device 160c7 can be a green shared light emitting device. The third shared light emitting device 160c3, the fourth shared light emitting device 160c4, and the ninth shared light emitting device 160c9 can be a blue shared light emitting device.

The first semiconductor light emitting devices R which are red light emitting devices can be disposed in the first to fourth main pixels 150M1, 150M2, 150M3, and 150M 4 closest to the fifth shared light emitting device 160c5 which is a red shared light emitting device.

The shared redundancy pixel can include a shared outer redundancy pixel 160CP disposed at the outer portion of the display panel of the display device.

The shared outer redundancy pixel 160CP can include a first shared light emitting device 160c1, a second shared light emitting device 160c2, a third shared light emitting device 160c3, a fourth shared light emitting device 160c4, a fifth shared light emitting device 160c5, a sixth shared light emitting device 160c6, a seventh shared light emitting device 160c7, an eighth shared light emitting device 160c8 and a ninth shared light emitting device 160c9.

In the shared outer redundancy pixel 160CP, the first shared light emitting device 160cl and the fourth shared light emitting device 160c4, the seventh shared light emitting device 160c7, the eighth shared light emitting device 160c8, and the ninth shared light emitting device 160c9 can be an outer shared light emitting device on the outer portion of the display panel.

The main pixel group 150MG can include first-second main pixel 150M12, third-second main pixel 150M32 and fourth-second main pixel 150M42 disposed at the outermost portion of the display panel.

Each of the first-second main pixel 150M12, the third-second main pixel 150M32, and the fourth-second main pixel 150M42 can include an embedded redundancy light emitting device.

The first-second main pixel 150M12 can include the first semiconductor light emitting device R, the second semiconductor light emitting device G, and the third semiconductor light emitting device B and the third internal shared light emitting device b.

Effects of the Invention

According to the display device including the semiconductor light emitting device according to the embodiment, there is a technical effect of arranging the shared semiconductor light emitting device around the main pixel to improve a yield and reduce the difficulty of the panel design and the transfer process.

For example, when the first main pixel 150M1 includes a first error light emitting device 160E1 in the panel area after transferring, and the first error light emitting device 160E1 is a device that emits red light, among the shared light emitting devices adjacent to the first error light emitting device 160E1, the fifth shared light emitting device 160c5 capable of emitting red can function as an auxiliary pixel so that the first main pixel 150M1 operates as a normal unit pixel.

In addition, according to the embodiment, by arranging a shared semiconductor light emitting device around the main pixel to operate the corresponding main pixel as a normal unit pixel through the shared redundancy pixel even when one main pixel itself is defective, there is a special technical effect that can significantly reduce the difficulty of panel design and transfer process while significantly improving the yield.

For example, in the embodiment, the fourth operation example 100MC1-4 is an example in which the entire first main pixel 150M1 is defective and the entire third main pixel 150M3 is defective. In the embodiment, in the fourth operation example 100MC1-4, the fifth shared light emitting device 160c5 adjacent to the first error light emitting device 160E1 functions as an auxiliary pixel, a fourth shared light emitting device 160c4 adjacent to the second error light emitting device 160E2 functions as an auxiliary pixel, and the second shared light emitting device 160c2 adjacent to the third error light emitting device 160E3 functions as an auxiliary pixel. Accordingly, the first main pixel 150M1 can function as a normal unit pixel.

Also, according to the example, by disposing a shared semiconductor light emitting device around the main pixel, even when the two main pixels themselves are defective, the corresponding main pixel operates as normal unit pixels through the shared auxiliary pixel. There is a special technical effect that can significantly reduce the difficulty of panel design and transfer process while significantly improving the yield.

Also, according to the second shared redundancy structure (100MC2) in the embodiment, optimizing the arrangement of the shared light emitting device or the arrangement of the semiconductor light emitting device of the main pixel in consideration of the color of the shared light emitting device and the light emitting color of the semiconductor light emitting device that is each sub-pixel constituting the main pixel, by increasing the probability that the shared light emitting device can function as an auxiliary pixel when an error occurs in the semiconductor light emitting device of the main pixel, there is a technical effect that can reduce the difficulty of panel design and transfer process while improving the yield.

Also, according to the embodiment, there is a special technical effect of remarkably reducing the difficulty of panel design and transfer process while remarkably improving the yield by arranging the shared semiconductor light emitting device around the main pixel in the outer area of the panel.

Also, in the display device 100 including the semiconductor light emitting device according to the embodiment, the second outer shared redundancy structure 100MCP2 disposed at the outermost portion of the display panel can include an outer shared light emitting device 160CP and a redundancy light emitting device embedded in the second outer main pixel 150MG2, there is a special technical effect of assisting the error of the main pixel in the outermost part of the display panel, which is difficult to additionally share the shared light emitting device with the adjacent panel, to function as a normal display pixel.

For example, the first-second main pixel 150M12 can include a third internal shared light emitting device b in addition to the first light emitting device R, the second light emitting device G, and the third light emitting device B.

At this time, when an error occurs in the third light emitting device (B), which is a blue light emitting device, as the third internal shared light emitting device b capable of emitting blue light emits light as an auxiliary light emitting device, the first-second main pixel 150M12 can function as a normal unit pixel.

The technical effects of the embodiments are not limited to those described in this item, and include those that can be understood through the description of the invention.

BRIEF DESCRIPTION OF THE DRAWING

FIG. 1 is an exemplary view in which a display device 100 according to an embodiment is disposed in a living room together with a washing machine 10, a robot cleaner 20, an air purifier 30, and the like.

FIG. 2 is an enlarged view of the first panel area 100A1 in the display device 100 shown in FIG. 1.

FIG. 3A is a cross-sectional view of one unit pixel 150L in the first panel area 100A1 shown in FIG. 2.

FIG. 3B is a cross-sectional view of the first semiconductor light emitting device 150R which is one of the sub-pixels of the unit pixel in FIG. 3A.

FIG. 4A is a conceptual diagram illustrating a first shared redundancy structure 100MC1 including a main pixel and a shared auxiliary light emitting device in the display device shown in FIG. 2.

FIG. 4B is an enlarged view of the first shared redundancy structure 100MC1 of FIG. 4A.

FIGS. 5A to 5D show an example of operation of the first shared redundancy structure 100MC1 in the embodiment.

FIG. 6 is a conceptual diagram of a second shared redundancy structure 100MC2.

FIG. 7A is a conceptual diagram illustrating a first shared redundancy structure 100MC1 and a first outer shared redundancy structure 100MCP1 including a main pixel group 150MG and a shared light emitting device in the display device shown in FIG. 2

FIG. 7B is a detailed view of the first perimeter shared redundancy structure 100MCP1 in FIG. 7A.

FIG. 8 is a detailed view of a second outer shared redundancy structure 100MCP2.

MODE FOR INVENTION

Hereinafter, the embodiments disclosed in the present specification will be described in detail with reference to the accompanying drawings, but the same or similar components are given the same reference sign regardless of the reference numerals, and the redundant description thereof will be omitted. The suffixes "module" and "part" for components used in the following description are given or mixed in consideration of only the ease of writing the specification, and do not have a meaning or role distinct from each other by themselves. Also, the accompanying drawings are for easy understanding of the embodiments disclosed in the present specification, and the technical spirit disclosed in the present specification is not limited by the accompanying drawings. Also, when an element, such as a layer, area, or substrate, is referred to as being 'on' another component, this includes that it is directly on the other element or there can be other intermediate elements in between.

The display device described in this specification can include a mobile phone, a smart phone, a laptop computer, a Digital broadcasting terminal, a personal digital assistant (PDA), a portable multimedia player (PMP), a navigation, a slate PC, a tablet PC, an ultra-book, a digital TV, a desktop computer, etc. However, the configuration according to the embodiment described in the present specification can be applied to a device capable of displaying even a new product form to be developed later.

Hereinafter, a display device including a semiconductor light emitting device according to an embodiment will be described.

FIG. 1 is an exemplary view in which the display device 100 according to the embodiment is disposed in the living room together with the washing machine 10, the robot cleaner 20, the air purifier 30, and the like.

The display device 100 of the embodiment can display the status of various electronic products such as the air cleaner 30, the robot cleaner 20, and the washing machine 10, can communicate wirelessly with each electronic product based on IOT and can control each electronic product based on user's setting data.

The display device 100 according to the embodiment can include a flexible display fabricated on a thin and flexible substrate. The flexible display can be bent or rolled like paper while maintaining characteristics of a conventional flat panel display.

In the flexible display, visual information can be implemented by independently controlling light emission of unit pixels arranged in a matrix form. The unit pixel means a minimum unit for realizing one color. The unit pixel of the flexible display can be implemented by a semiconductor light emitting device. In an embodiment, the semiconductor light emitting device can be a Micro-LED, but is not limited thereto.

Next, FIG. 2 is an enlarged view of the first panel area 100A1 in the display device 100 shown in FIG. 1.

FIG. 3A is a cross-sectional view of one unit pixel 150L in the first panel area 100A1 shown in FIG. 2.

FIG. 3B is a cross-sectional view of the first semiconductor light emitting device 150R which is one of the sub-pixels of the unit pixel in FIG. 3A.

Referring to FIG. 2, the display device 100 of the embodiment can include a plurality of panel areas including the first panel area 100A1. In the display device, each panel area can be mechanically coupled by tiling and electrically connected to form the display device 100.

The first panel area 100A1 in FIG. 2 can include a shared redundancy pixel 160C with the main pixel area 150M.

The main pixel area 150M can include a plurality of unit pixels 150L, and each unit pixel 150L can include a first semiconductor light emitting device R, a second semiconductor light emitting device G, and a third semiconductor light emitting device B as sub-pixels. The first semiconductor light emitting device R, the second semiconductor light emitting device G, and the third semiconductor light emitting device B can be a red light emitting device R, a green light emitting device G, and a blue light emitting device B, respectively, but is not limited thereto.

The shared auxiliary pixel 160C can include a plurality of shared light emitting devices. Referring briefly to FIG. 4b, the shared redundancy pixel 160C can include a first group shared light emitting device disposed between the plurality of main pixels and a second group shared light emitting device disposed around the plurality of main pixels.

The main pixel area 150M can include a main pixel group 150MG including a first main pixel 150M1, a second main pixel 150M2, a third main pixel 150M3 and a fourth main pixel 150M4 disposed adjacent to each other.

The shared auxiliary pixel 160C can include a first shared light emitting device 160c1, a second shared light emitting device 160c2, a third shared light emitting device 160c3, a fourth shared light emitting device 160c4, a fifth shared light emitting device 160c5, a sixth shared light emitting device 160c6, a seventh shared light emitting device 160c7, an eighth shared light emitting device 160c8, and a ninth shared light emitting device 160c9.

The first group shared light emitting device disposed between the plurality of main pixels can be a fifth shared light emitting device 160c5, and the second group shared light emitting device disposed around the plurality of main pixels can include first to fourth and sixth to ninth shared light emitting devices (160c1, 160c2, 160c3, 160c4, 160c5, 160c6, 160c7, 160c8, 160c9), but is not limited thereto.

The first shared light emitting device 160c1, the fifth shared light emitting device 160c5, and the ninth shared light emitting device 160c9 can be a Red R shared light emitting device, the third shared light emitting device 160c3, the fourth shared light emitting device 160c4, and the eighth shared light emitting device 160c8 can be a Green G shared light emitting device, the second shared light emitting device 160c2, the sixth shared light emitting device 160c6, and the seventh shared light emitting device 160c7 can be a blue B shared light emitting device, but is not limited thereto.

Referring back to FIG. 2, in the embodiment, each semiconductor light emitting device can be driven by an active matrix (AM) method or a passive matrix (PM) method.

Next, referring to FIGS. 3A and 3B, FIG. 3A is a cross-sectional view of one unit pixel 150L in the first panel area 100A1 shown in FIG. 2. FIG. 3B is a cross-sectional view of the first semiconductor light emitting device 150R which is one of the sub-pixels of the unit pixel in FIG. 3A.

Referring to FIG. 3A, the display device 100 according to the embodiment can include a panel substrate 110, a first panel electrode 120, a second panel electrode (not shown), an insulating layer 130, and a plurality of semiconductor light emitting devices. For example, the unit pixel 150L of the embodiment can include a plurality of sub-pixels including a red light emitting device 150R, a green light emitting device 150G, and a blue light emitting device 150B.

Each of the semiconductor light emitting device can be a semiconductor light emitting device that emits red, green and blue light to form a sub-pixel, but is not limited thereto, and each of the semiconductor light emitting devices can include a red phosphor and a green phosphor to implement red and green respectively.

The panel substrate 110 can be formed of glass or polyimide. In addition, the panel substrate 110 can include a flexible material such as polyethylene naphthalate (PEN) or polyethylene terephthalate (PET). In addition, the panel substrate 110 can be made of a transparent material, but is not limited thereto.

The insulating layer 130 can include an insulating and flexible material such as polyimide, PEN, PET, etc., and can be integrally formed with the panel substrate 110 to form a single substrate.

The insulating layer 130 can be a conductive adhesive layer having adhesiveness and conductivity, and the conductive adhesive layer can have flexibility to enable a flexible function of the display device. For example, the insulating layer 130 can be an anisotropy conductive film (ACF) or a conductive adhesive layer such as an anisotropic conductive medium or a solution containing conductive particles. The conductive adhesive layer can be a layer that is electrically conductive in a direction perpendicular to the thickness, but electrically insulating in a direction horizontal to the thickness.

Next, referring to FIG. 3B, the first semiconductor light emitting device 150R, which is one of the sub-pixels of the unit pixel, can be a vertical type semiconductor light emitting device. The semiconductor light emitting device that can be employed in the embodiment is not limited to the vertical type semiconductor light emitting device, and can include a lateral type semiconductor light emitting device or a flip type light emitting device.

The semiconductor light emitting device employed in the embodiment is a p-n junction diode in which electric energy is converted into light energy, and can be made of a compound semiconductor containing elements of Groups III and V on the periodic table, and can implement various colors such as red, green, and blue by controlling the band gap energy by adjusting the composition ratio of the compound semiconductor.

Next, FIG. 4A is a conceptual diagram illustrating a first shared redundancy structure 100MC1 including a main pixel and a shared auxiliary light emitting device in the display device shown in FIG. 2.

FIG. 4B is an enlarged view of the first shared redundancy structure 100MC1 of FIG. 4A.

Referring to FIG. 4B, in the embodiment, the first shared redundancy structure 100MC1 can include a main pixel group 150MG and a shared auxiliary pixel 160C, and the shared auxiliary pixel 160C can include a plurality of shared light emitting devices. The shared light emitting device can function as an auxiliary light emitting device.

In the first shared redundancy structure 100MC1, the main pixel group 150MG can include a first main pixel 150M1, a second main pixel 150M2, a third main pixel 150M3, and a fourth main pixel 150M4.

Each of the first to fourth main pixels 150M1,150M2, 150M3, and 150M4 functions as a unit pixel and can include a first semiconductor light emitting device R, a second semiconductor light emitting device G, and a third semiconductor light emitting device B, respectively. The first semiconductor light emitting device R can be a red light emitting device, the second semiconductor light emitting device G can be a green light emitting device, the third semiconductor light emitting device B can be a blue light emitting device, but is not limited thereto.

The first to third light emitting devices R, G, and B can be any one or more of a horizontal light emitting device, a vertical light emitting device, and a flip type light emitting device.

The shared auxiliary pixel 160C can include a first shared light emitting device 160c1, a second shared light emitting device 160c2, a third shared light emitting device 160c3, a fourth shared light emitting device 160c4, a fifth shared light emitting device 160c5, a sixth shared light emitting device 160c6, a seventh shared light emitting device 160c7, an eighth shared light emitting device 160c8, and a ninth shared light emitting device 160c9.

The first shared light emitting device 160c1, the fifth shared light emitting device 160c5, and the ninth shared light emitting device 160c9 can be a Red shared light emitting device, the third shared light emitting device 160c3, the fourth shared light emitting device 160c4, and the eighth shared light emitting device 160c8 can be a green shared light emitting device, the second shared light emitting device 160c2, the sixth shared light emitting device 160c6, and the seventh shared light emitting device 160c7 can be a blue shared light emitting device, but is not limited thereto.

According to the first shared redundancy structure 100MC1 of the embodiment, the 2×2 main pixel group 150MG can be a structure surrounded by the shared auxiliary pixel 160C including nine shared light emitting devices.

The shared auxiliary pixel 160C can have three chips for each RGB color, and can include a total of nine shared light emitting devices, but is not limited thereto.

Next, FIGS. 5A to 5D are an operation example of the first shared redundancy structure 100MC1 in the embodiment.

FIG. 5A is a first operational example 100MC1-1 of the first shared redundancy structure 100MC1 in the embodiment.

In the embodiment, the first operation example 100MC1-1 is an example in which the first semiconductor light emitting device R in the first main pixel 150M1 is defective. For example, an example is when the first main pixel 150M1 includes the first error light emitting element 160E1, and the first error light emitting element 160E1 is a case where the light emitting element emitting red is defective.

In the embodiment, in the first operation example 100MC1-1, among the shared redundancy pixels, the fifth shared light emitting device 160c5 capable of emitting red light among the shared light emitting devices adjacent to the first error light emitting device 160E1 can function as an auxiliary pixel.

For example, when the first main pixel 150M1 includes the first error light emitting device 160E1 in the panel area after transfer and the first error light emitting device 160E1 is a device that emits red light, among the shared light emitting devices adjacent to the first error light emitting device 160E1, the fifth shared light emitting device 160c5 capable of emitting red can function as an auxiliary pixel so that the first main pixel 150M1 operates as a normal unit pixel.

Accordingly, according to the embodiment, there is a technical effect that can reduce the difficulty of panel design and transfer process while significantly improving the yield by disposing the shared semiconductor light emitting device around the main pixel.

Next, FIG. 5B is a second operation example 100MC1-2 of the first shared redundancy structure 100MC1 in the embodiment.

In the embodiment, the second operation example 100MC1-2 is an example in which the first semiconductor light emitting device R is defective in the first main pixel 150M1 and the third semiconductor light emitting device B is defective in the fourth main pixel 150M4.

For example, the example is a case in which the first main pixel 150M1 includes the first error light emitting device 160E1 in the red light emitting area and the fourth main pixel 150M4 includes the second error light emitting device 160E2 in the blue light emitting area.

In the embodiment, in the second operation example 100MC1-2, a fifth shared light emitting device 160c5 capable of emitting red among the shared light emitting devices adjacent to the first error light emitting device 160E1 among the shared redundancy pixels functions as an auxiliary pixel so that the main pixel 150M1 operates as a normal unit pixel.

Also, among the shared redundancy pixels, as a seventh shared light emitting device 160c7 capable of emitting blue among the shared light emitting devices adjacent to the second error light emitting device 160E2 functions as an auxiliary pixel, the fourth main pixel 150M4 can operate as a normal unit pixel.

Accordingly, according to the embodiment, there is a technical effect of remarkably reducing the difficulty of the panel design and the transfer process while remarkably improving the yield by disposing the shared semiconductor light emitting device around the main pixel.

Next, FIG. 5C is a third operation example 100MC1-3 of the first shared redundancy structure 100MC1 in the embodiment.

In the embodiment, the third operation example 100MC1-3 is an example in which the entire first main pixel 150M1 is defective. This is an example in which all of the first semiconductor light emitting device R emitting red light of the first main pixel 150M1, the second semiconductor light emitting device G emitting green light, the third semiconductor light emitting devices B emitting blue light are defective, including the first error light emitting device 160E1, the second error light emitting device 160E2, and the third error light emitting device 160E3, respectively.

In the third operation example 100MC1-3 of the embodiment, among the shared redundancy pixels, the fifth shared light emitting device 160c5 capable of emitting red light among the shared light emitting devices adjacent to the first error light emitting device 160E1 can function as an auxiliary pixel.

Also in the embodiment, in the third operation example 100MC1-3, among the shared redundancy pixels, the fourth shared light emitting device 160c4 capable of emitting green light among the shared light emitting devices adjacent to the second error light emitting device 160E2 can serve as an auxiliary pixel.

In the example, in the third operation example 100MC1-3, among the shared redundancy pixels, the second shared light emitting device 160c2 capable of emitting blue light among the shared light emitting devices adjacent to the third error light emitting device 160E3 can function as an auxiliary pixel.

Accordingly, according to the embodiment, by arranging a shared semiconductor light emitting device around the main pixel, even when any one of the main pixels itself is defective, the corresponding main pixel operates as a normal unit pixel through the shared auxiliary pixel. There are technical effects that can significantly reduce the difficulty of panel design and transfer process while significantly improving the yield.

Next, FIG. 5D is a fourth operation example 100MC1-4 of the first shared redundancy structure 100MC1 in the embodiment.

In the embodiment, the fourth operation example 100MC1-4 is an example in which the entire first main pixel 150M1 is defective and the entire third main pixel 150M3 is defective.

For example, in the embodiment, the third operation example 100MC1-3 is an example in which all of the first semiconductor light emitting device R emitting red light of the first main pixel 150M1, the second semiconductor light emitting device G emitting green light and the third semiconductor light emitting devices B emitting blue light are defective, including the first error light emitting device 160E1, the second error light emitting device 160E2, and the third error light emitting device 160E3, respectively.

Also, in the embodiment, the third operation example 100MC1-3 is an example in which the entire third main pixel 150M3 is defective. This is an example in which all of the first semiconductor light emitting device R emitting red light of the third main pixel 150M3, the second semiconductor light emitting device G emitting green light and the third semiconductor light emitting devices B that emit blue are defective, including the fourth error light emitting device 160E4, the fifth error light emitting device 160E5, and the sixth error light emitting device 160E6, respectively.

In the embodiment, the fourth operation example 100MC1-4 can allow the first main pixel 150M1 to function as a normal unit pixel as the fifth shared light emitting device 160c5 adjacent to the first error light emitting device 160E1 functions as an auxiliary pixel, the fourth shared light emitting device 160c4 adjacent to the second error light emitting device 160E2 functions as an auxiliary pixel, the second shared light emitting device 160c2 adjacent to the third error light emitting device 160E3 functions as an auxiliary pixel.

Also in the embodiment, the fourth operation example 100MC1-4 among the shared redundancy pixels, the ninth shared light emitting device 160c9 capable of emitting red light among the shared light emitting devices adjacent to the fourth error light emitting device 160E4 can function as an auxiliary pixel.

Also in the fourth operation example (100MC1-4) of the embodiment, among the shared redundancy pixels, the eighth shared light emitting device 160c8 capable of emitting green light among the shared light emitting devices adjacent to the fifth error light emitting device 160E5 can function as an auxiliary pixel.

In the fourth operation example 100MC1-4 of the embodiment, among the shared redundancy pixels, a sixth shared light emitting device 160c6 capable of emitting blue light among shared light emitting devices adjacent to the sixth error light emitting device 160E6 can function as an auxiliary pixel.

Accordingly, according to the embodiment, by arranging a shared semiconductor light emitting device around the main pixel to operate the corresponding main pixel as normal unit pixels through the shared auxiliary pixel even when the two main pixels themselves are defective, there are technical effects that can significantly reduce the difficulty of panel design and transfer process while significantly improving the yield.

FIG. 6 is a conceptual diagram of a second shared redundancy structure 100MC2.

The second shared redundancy structure 100MC2 can employ a technical feature of the first shared redundancy structure 100MC1.

For example, in an embodiment, the second shared redundancy structure 100MC2 can include a plurality of main pixel groups 150MG and a shared auxiliary pixel 160C, the shared auxiliary pixel 160C can include a plurality of shared light emitting devices. The shared light emitting device can function as an auxiliary light emitting device.

In the second shared redundancy structure 100MC2 of the embodiment, the main pixel group 150MG can include a first main pixel 150M1, a second main pixel 150M2, a third main pixel 150M3, and a fourth main pixel 150M4 disposed adjacent to each other.

The first to fourth main pixels 150M1,150M2,150M3, and 150M4 can include a first semiconductor light emitting device R, a second semiconductor light emitting device G, and a third semiconductor light emitting device B, respectively. The first semiconductor light emitting device R can be a red light emitting device, the second semiconductor light emitting device G can be a green light emitting device, and the third semiconductor light emitting device B can be a blue light emitting device, but is not limited thereto.

The first to third light emitting devices R, G, and B can be any one or more of a horizontal light emitting device, a vertical light emitting device, and a flip type light emitting device.

In addition, the shared auxiliary pixel 160C can include a first shared light emitting device 160c1, a second shared light emitting device 160c2, a third shared light emitting device 160c3, a fourth shared light emitting device 160c4, a fifth shared light emitting device 160c5, a sixth shared light emitting device 160c6, a seventh shared light emitting device 160c7, an eighth shared light emitting device 160c8, and a ninth shared light emitting device 160c9.

According to the display device including the semiconductor light emitting device according to the embodiment, there are technical effects of arranging the shared semiconductor light emitting device around the main pixel to improve the yield and reduce the difficulty of the panel design and the transfer process.

Hereinafter, the technical characteristics of the second shared redundancy structure 100MC2 will be mainly described.

In the second shared redundancy structure 100MC2, the shared light emitting device can be disposed in consideration of the emitting color of the light emitting device of the main pixel.

Alternatively, in the second shared redundancy structure 100MC2, a semiconductor light emitting device, which is each sub-pixel constituting the main pixel, can be disposed in consideration of the color of the shared light emitting device.

For example, the second shared light emitting device 160c2, the fifth shared light emitting device 160c5, and the eighth shared light emitting device 160c8 can be a Red shared light emitting device, the first shared light emitting device 160c1, the sixth shared light emitting device 160c6, and the seventh shared light emitting device 160c7 can be a green shared light emitting device, and the third shared light emitting device 160c3, the fourth shared light emitting device 160c4, and the ninth shared light emitting device 160c9 can be a blue shared light emitting device, but is not limited thereto.

According to the second shared redundancy structure 100MC2 of the embodiment, in the first to fourth main pixels 150M1, 150M2, 150M3, and 150M4, the first semiconductor light emitting devices R, which are red light emitting devices, can be disposed adjacent to the shared red light emitting device among the shared auxiliary pixels 160C.

For example, the first semiconductor light emitting devices R which are red light emitting devices can be disposed in the first to fourth main pixels 150M1,150M2, 150M3, and 150M4 closest to the fifth shared light emitting device 160c5 which is a red shared light emitting device.

In the example, the second shared light emitting device 160c2, the fifth shared light emitting device 160c5, and the eighth shared light emitting device 160c8 capable of emitting red light can be disposed in a vertically overlapping position, but is not limited thereto.

According to the second shared redundancy structure 100MC2 in the embodiment, optimizing the arrangement of the shared light emitting device or the arrangement of the semiconductor light emitting device of the main pixel in consideration of the color of the shared light emitting device and the light emitting color of the semiconductor light emitting device that is each sub-pixel constituting the main pixel, by increasing the probability that the shared light emitting device can function as an auxiliary pixel when an error occurs in the semiconductor light emitting device of the main pixel, there are technical effects that can reduce the difficulty of panel design and transfer process while improving the yield.

Figure 7A:
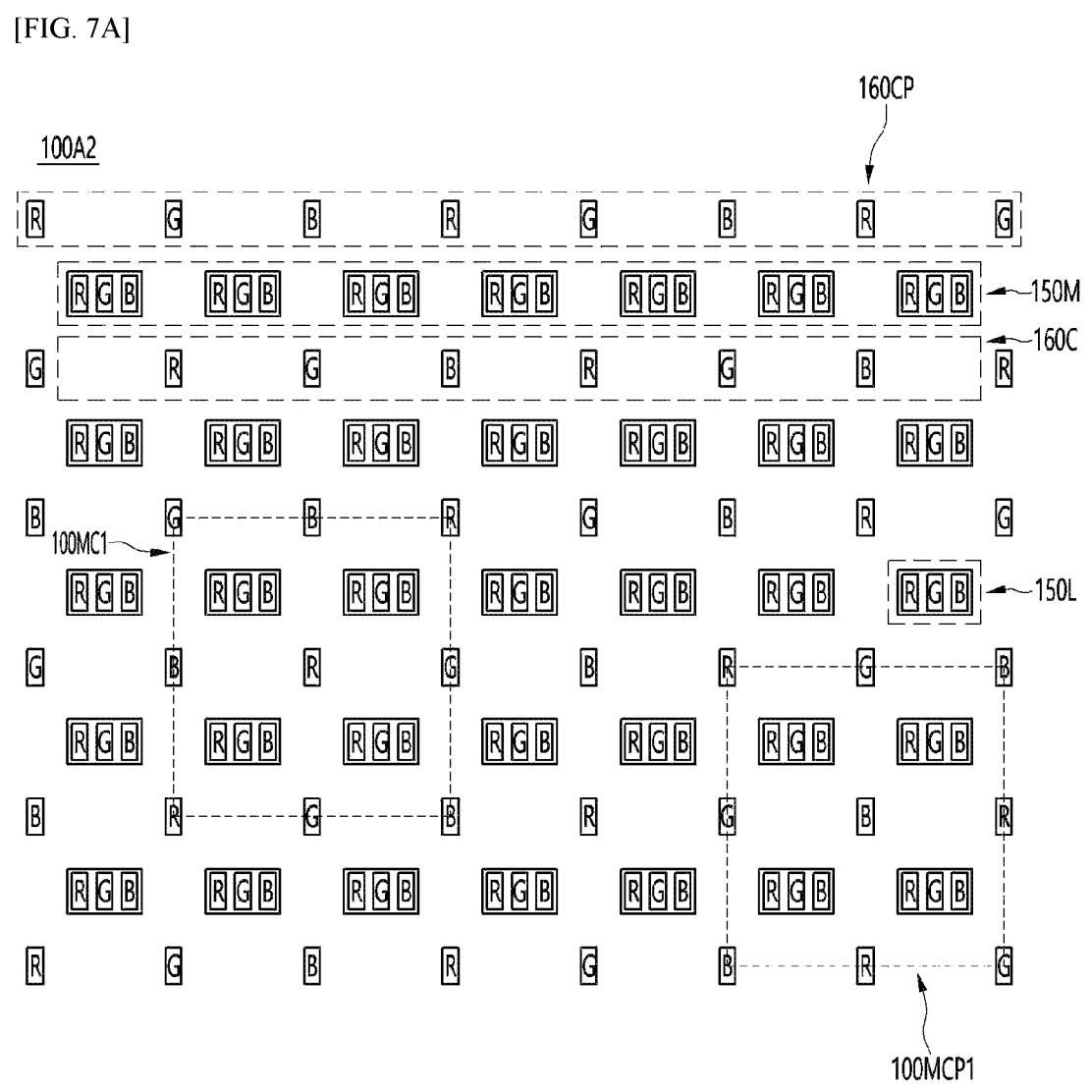

Next, FIG. 7A is a conceptual diagram illustrating a first shared redundancy structure 100MC1 including a main pixel group 150MG and a shared light emitting device and a first outer shared redundancy structure 100MCP1 in the display device shown in FIG. 2.

Referring to FIG. 7A, in the embodiment, the shared light emitting device can include an outer shared light emitting device 160CP.

FIG. 7B is a detailed view of the first outer shared redundancy structure 100MCP1 in FIG. 7A.

Referring to FIG. 7B, in the embodiment, similar to the first shared redundancy structure 100MC1 in the first outer shared redundancy structure 100MCP1, the main pixel group 150MG can include a first main pixel 150M1, a second main pixel 150M2, a third main pixel 150M3 and a fourth main pixel 150M4 disposed adjacent to each other.

The first to fourth main pixels 150M1,150M2,150M3 and 150M4 can include a first semiconductor light emitting device R, a second semiconductor light emitting device G, and a third semiconductor light emitting device B, respectively. The first semiconductor light emitting device R can be a red light emitting device, the second semiconductor light emitting device G can be a green light emitting device, and the third semiconductor light emitting device B can be a blue light emitting device, but is not limited thereto.

The first to third light emitting devices R, G, and B can be any one or more of a horizontal light emitting device, a vertical light emitting device, and a flip type light emitting device.

Referring to FIG. 7B, the first outer shared redundancy structure 100MCP1 can include the main pixel group 150MG and the shared outer auxiliary pixel 160CP.

The shared outer redundancy pixel 160CP can include a first shared light emitting device 160c1, a second shared light emitting device 160c2, a third shared light emitting device 160c3, a fourth shared light emitting device 160c4, a fifth shared light emitting device 160c5, a sixth shared light emitting device 160c6, a seventh shared light emitting device 160c7, an eighth shared light emitting device 160c8, and a ninth shared light emitting device 160c9.

In the shared outer auxiliary pixel 160CP, the first shared light emitting device 160c1, the fourth shared light emitting device 160c4, the seventh shared light emitting device 160c7, the eighth shared light emitting device 160c8, and the ninth shared light emitting device 160c9 can be an outer shared light emitting device.

According to the embodiment, there are special technical effects of remarkably reducing the difficulty of panel design and transfer process while remarkably improving the yield by disposing the shared semiconductor light emitting device around the main pixel in the outer area of the panel.

Next, FIG. 8 is a detailed view of the second outer shared redundancy structure 100MCP2.

The second outer shared redundancy structure 100MCP2 is different from the first shared redundancy structure 100MC1, a redundancy light emitting device can be embedded in the main pixel 150M12, the third-second main pixel 150M32, and the fourth-second main pixel 150M42 disposed on the outer part of the second outer main pixel 150MG2.

For example, the first-second main pixel 150M12 can include a first semiconductor light emitting device R, a second semiconductor light emitting device G, a third semiconductor light emitting device B, and a third internal shared light emitting device b.

The first semiconductor light emitting device R can be a red light emitting device, the second semiconductor light emitting device G can be a green light emitting device, the third semiconductor light emitting device B can be a blue light emitting device, and the third internal shared light emitting device b can be a blue light emitting device.

In addition, the third-second main pixel 150M32 can include a first semiconductor light emitting device R, a second semiconductor light emitting device G, and a third semiconductor light emitting device B and a second internal shared light emitting device g.

The first semiconductor light emitting device (R) can be a red light emitting device, the second semiconductor light emitting device G can be a green light emitting device, the third semiconductor light emitting device B can be a blue light emitting device, and the second internal shared light emitting device g can be a green light emitting device.

Also, the fourth-second main pixel 150M42 can include a first semiconductor light emitting device R, a second semiconductor light emitting device G, a third semiconductor light emitting device B, and a first internal shared light emitting device r.

The first semiconductor light emitting device (R) can be a red light emitting device, the second semiconductor light emitting device (G) can be a green light emitting device, the third semiconductor light emitting device B can be a blue light emitting device, and the first internal shared light emitting device (r) can be a red light emitting device.

According to the embodiment, unlike the first shared redundancy structure 100MC, the second outer shared redundancy structure 100MCP2, which is a redundancy structure of the outer area of the panel, can include a redundancy light emitting device embedded in a first-second main pixel 150M12, a third-second main pixel 150M32, and a fourth-second main pixel 150M42 disposed at an outer portion of the second main pixel.

In addition, in the display device 100 including the semiconductor light emitting device according to the embodiment, the second outer shared redundancy structure 100MCP2 disposed at the outermost portion of the display panel includes an outer shared light emitting device 160CP and a redundancy light emitting device embedded in the second outer main pixel 150MG2, there is a special technical effect of assisting the error of the main pixel in the outermost part of the display panel, which is difficult to additionally share the shared light emitting device with the adjacent panel, to function as a normal display pixel.

For example, the first-second main pixel 150M12 can include a third internal shared light emitting device b in addition to the first semiconductor light emitting device R, the second semiconductor light emitting device G and the third semiconductor light emitting device B.

At this time, when an error occurs in the third semiconductor light emitting device B, which is a blue light emitting device, as the third internal shared light emitting device b capable of emitting blue light emits light as an auxiliary light emitting device, the first-second main pixel 150M12 can function as a normal unit pixel.

Also, the third-second main pixel 150M32 can include a second internal shared light emitting device g in addition to the first semiconductor light emitting device R, the second semiconductor light emitting device G, and the third semiconductor light emitting device B.

In this case, when an error occurs in the second semiconductor light emitting device G, which is a green light emitting device, as the second internal shared light emitting device g, which is a green light emitting device, emits light as an auxiliary light emitting device, the third-second main pixel 150M32 can function as a normal unit pixel.

Also, the fourth-second main pixel 150M42 can include a first internal shared light emitting device r in addition to first semiconductor light emitting device R, the second semiconductor light emitting device G and the third semiconductor light emitting device B.

In this case, when the first semiconductor light emitting device R, which is a red light emitting device, is defective, as the first internal shared light emitting device r, which is a red light emitting device, emits light, the fourth-second main pixel 150M42 can function as a normal unit pixel.

According to the display device including the semiconductor light emitting device according to the embodiment, there are technical effects of arranging the shared semiconductor light emitting device around the main pixel to improve the yield while reducing the difficulty of the panel design and the transfer process.

In addition, according to the embodiment, by arranging a shared semiconductor light emitting device around the main pixel to operate the corresponding main pixel as a normal unit pixel through the shared redundancy pixel even when one main pixel itself is defective, there are special technical effects that can significantly reduce the difficulty of panel design and transfer process while significantly improving the yield.

In addition, according to the example, by disposing a shared semiconductor light emitting device around the main pixel, even when the two main pixels themselves are defective, the corresponding main pixel operates as normal unit pixels through the shared auxiliary pixel. There is a special technical effect that can significantly reduce the difficulty of panel design and transfer process while significantly improving the yield.

Also according to the second shared redundancy structure 100MC2 in the embodiment, optimizing the arrangement of the shared light emitting device or the arrangement of the semiconductor light emitting device of the main pixel in consideration of the color of the shared light emitting device and the light emitting color of the semiconductor light emitting device that is each sub-pixel constituting the main pixel, by increasing the probability that the shared light emitting device can function as an auxiliary pixel when an error occurs in the semiconductor light emitting device of the main pixel, there is a technical effect that can reduce the difficulty of panel design and transfer process while improving the yield.

In addition, according to the embodiment, there is a special technical effect that can significantly reduce the difficulty of panel design and transfer process while remarkably improving the yield by disposing the shared semiconductor light emitting device around the main pixel in the outer area of the panel.

In addition, in the display device 100 including the semiconductor light emitting device according to the embodiment, the second outer shared redundancy structure 100MCP2 disposed at the outermost portion of the display panel includes an outer shared light emitting device 160CP and a redundancy light emitting device embedded in the second outer main pixel 150MG2, there is a special technical effect of assisting the error of the main pixel in the outermost part of the display panel, which is difficult to additionally share the shared light emitting device with the adjacent panel, to function as a normal display pixel.

INDUSTRIAL APPLICABILITY

The semiconductor light emitting device according to the embodiment is not limited to the micro LED, but also includes a mini LED.

The semiconductor light emitting device according to the embodiment can be applied to a relatively large area LED for lighting and signage in addition to the micro LED display.

In addition, the display device including the semiconductor light emitting device according to the embodiment can include a Digital TV, a mobile phone, a smart phone, a laptop computer, a digital broadcasting terminal, a PDA (personal digital assistants), a PMP (portable multimedia player), a navigation system, a Slate PC, a Tablet PC, an Ultra-Book, a desktop computer, and the like.

The above description is merely illustrative of the technical idea of the embodiment, and various modifications and variations are possible by those skilled in the art to which the embodiment belongs without departing from the essential characteristics of the embodiment.

Accordingly, the embodiments disclosed in the embodiments are for explanation rather than limiting the technical spirit of the embodiments, and the scope of the technical spirit of the embodiments is not limited by these embodiments.

The protection scope of the embodiment should be interpreted by the following claims, and all technical ideas within the scope equivalent thereto should be construed as being included in the scope of the embodiment.

The invention claimed is:

1. A display device including semiconductor light emitting devices, the display device comprising:

a main pixel group including a plurality of main pixels; and shared redundancy pixels including a plurality of shared light emitting devices disposed between and around the plurality of main pixels, wherein the main pixel group comprises the plurality of main pixels including a first semiconductor light emitting device, a second semiconductor light emitting device, and a third semiconductor light emitting device, wherein the shared redundancy pixels comprise a first group shared light emitting device disposed between the plurality of main pixels and a second group shared light emitting device disposed around the plurality of main pixels, wherein at least one main pixel of the plurality of main pixels comprises at least one error light emitting device having a defective light emitting device emitting a first color light, and wherein at least one shared light emitting device, which is adjacent to the at least one error light emitting device, among the plurality of shared light emitting devices of the shared redundancy pixels emits the first color light as an auxiliary pixel.

2. The display device according to claim 1, wherein the main pixel group comprises a first main pixel, a second main pixel, a third main pixel, and a fourth main pixel disposed adjacent to each other, wherein the first group shared light emitting device disposed between the plurality of main pixels comprises a fifth shared light emitting device, and wherein the second group shared light emitting device disposed around the plurality of main pixels comprises first to fourth and sixth to ninth shared light emitting devices.

3. The display device according to claim 2, wherein the first semiconductor light emitting device, the second semiconductor light emitting device and the third semiconductor light emitting device are a Red light emitting device, a Green light emitting device, and a Blue light emitting device respectively, wherein the first shared light emitting device, the fifth shared light emitting device, and the ninth shared light emitting device are Red shared light emitting devices, wherein the third shared light emitting device, the fourth shared light emitting device, and the eighth shared light emitting device are Green shared light emitting devices, and wherein the second shared light emitting device, the sixth shared light emitting device, and the seventh shared light emitting device are Blue shared light emitting devices.

4. The display device according to claim 3, wherein the first main pixel comprises a first error light emitting device having a defective light emitting device emitting red light, wherein the fifth shared light emitting device, which is adjacent to the first error light emitting device, among the shared light emitting devices of the shared redundancy pixels emits red light as an auxiliary pixel.

5. The display device according to claim 4, wherein the fourth main pixel comprises a second error light emitting device having a defective light emitting device emitting blue light, wherein among the shared redundancy pixels, the seventh shared light emitting device emitting blue light among the shared light emitting devices adjacent to the second error light emitting device emits blue light as an auxiliary pixel.

6. The display device according to claim 3, further comprising a first error light emitting device, a second error light emitting device, and a third error light emitting device in each region corresponding to each region of emitting red light, blue light, and green light in the first main pixel, respectively, wherein the fifth shared light emitting device adjacent to the first error light emitting device and emitting red light emits red light as an auxiliary pixel among the shared redundancy pixels, wherein the fourth shared light emitting device adjacent to the second error light emitting device and emitting green light emits green light as an auxiliary pixel among the shared redundancy pixels, and wherein the second shared light emitting device adjacent to the third error light emitting device and emitting blue light emits blue light as an auxiliary pixel.

7. The display device according to claim 6, further comprising a fourth error light emitting device, a fifth error light emitting device, and a sixth error light emitting device in each region corresponding to each region emitting red light, blue light, and green light in the third main pixel, respectively, wherein the ninth shared light emitting device adjacent to the fourth error light emitting device and emitting red light emits red light as auxiliary pixels among the shared redundancy pixels, wherein the eighth shared light emitting device adjacent to the fifth error light emitting device and emitting green light emits green light as an auxiliary pixel, and wherein the sixth shared light emitting device adjacent to the sixth error light emitting device and emitting blue light emits blue light as an auxiliary pixel.

8. The display device according to claim 2, wherein the first semiconductor light emitting device, the second semiconductor light emitting device and the third semiconductor light emitting device is a Red light emitting device, a Green light emitting device, and a Blue light emitting device respectively, wherein the second shared light emitting device, the fifth shared light emitting device and the eighth shared light emitting device are Red shared light emitting devices, wherein the first shared light emitting device, the sixth shared light emitting device, and the seventh shared light emitting device are Green shared light emitting devices, wherein the third shared light emitting device, the fourth shared light emitting device and the ninth shared light emitting device are Blue shared light emitting devices, and wherein first semiconductor light emitting devices that are red light emitting devices are disposed in the first to fourth main pixels closest to the fifth shared light emitting device that is a red shared light emitting device.

9. The display device according to claim 2, wherein the shared redundancy pixels comprise a shared outer redundancy pixel disposed at an outer portion of a display panel of the display device, wherein the shared redundancy pixels comprise a first shared light emitting device, a second shared light emitting device, a third shared light emitting device, a fourth shared light emitting device, a fifth shared light emitting device, a sixth shared light emitting device, a seventh shared light emitting device, an eighth shared light emitting device and a ninth shared light emitting device, and wherein the first shared light emitting device, the fourth shared light emitting device, the seventh shared light emitting device, the eighth shared light emitting device, and the ninth shared light emitting device among the shared redundancy pixels are outer shared light emitting devices disposed at the outer portion of the display panel.

10. The display device according to claim 9, wherein the main pixel group comprises a first-second main pixel, a third-second main pixel, and a fourth-second main pixel disposed at an outermost part of the display panel, and each of the first-second main pixel, the third-second main pixel, and the fourth-second main pixel comprises an embedded redundancy light emitting device.

11. The display device according to claim 10, wherein the first-second main pixel comprises the first semiconductor light emitting device, the second semiconductor light emitting device, the third semiconductor light emitting device, and a third internal shared light emitting device.

12. The display device according to claim 10, wherein the third-second main pixel comprises the first semiconductor light emitting device, the second semiconductor light emitting device, the third semiconductor light emitting device, and a second internal shared light emitting device.

13. The display device according to claim 10, wherein the fourth-second main pixel comprises the first semiconductor light emitting device, the second semiconductor light emitting device, the third semiconductor light emitting device, and a first internal shared light emitting device.

14. The display device according to claim 10, wherein the embedded redundancy light emitting device comprises a first internal shared light emitting device, a second internal shared light emitting device, and a third internal shared light emitting device, and wherein the first internal shared light emitting device is a red light emitting device, the second internal shared light emitting device is a green light emitting device, and the third internal shared light emitting device is a blue light emitting device.

15. The display device according to claim 11, wherein the first-second main pixel comprises a seventh error light emitting device in which a light emitting device emitting blue light is defective, the third internal shared light emitting device emits light as an auxiliary pixel.

16. The display device according to claim 12, wherein the third-second main pixel comprises an eighth error light emitting device in which a light emitting device emitting green light is defective, the second internal shared light emitting device emits light as an auxiliary pixel.

17. The display device according to claim 13, wherein the fourth-second main pixel comprises a ninth error light emitting device in which a light emitting device emitting red light is defective, the first internal shared light emitting device emits light as an auxiliary pixel.

* * * * *